(12) United States Patent
Han

(10) Patent No.: US 7,498,604 B2
(45) Date of Patent: Mar. 3, 2009

(54) DEPOSITION STOP TIME DETECTION APPARATUS AND METHODS FOR FABRICATING COPPER USING THE SAME

(75) Inventor: Jae-Won Han, Bucheon (KR)

(73) Assignee: Dongbu HiTek Co., Ltd., Seoul (KR)

(*) Notice: Subject to any disclaimer, the term of this patent is extended or adjusted under 35 U.S.C. 154(b) by 73 days.

(21) Appl. No.: 11/520,303

(22) Filed: Sep. 12, 2006

(65) Prior Publication Data
US 2007/0010034 A1 Jan. 11, 2007

Related U.S. Application Data

(63) Continuation of application No. 10/869,263, filed on Jun. 16, 2004, now Pat. No. 7,122,387.

(30) Foreign Application Priority Data
Jun. 19, 2003 (KR) .................. 10-2003-0039907

(51) Int. Cl.
*H01L 23/58* (2006.01)
*H01L 29/10* (2006.01)
(52) U.S. Cl. .............. 257/48; 438/17; 257/E21.522; 257/E21.531
(58) Field of Classification Search ............... 438/17, 438/18; 257/48, E21.522, E21.531, E21.528, 257/E21.529, E21.52, E21.53
See application file for complete search history.

(56) References Cited

U.S. PATENT DOCUMENTS

| 5,290,396 | A | 3/1994 | Schoenborn et al. |
|---|---|---|---|
| 5,400,209 | A | 3/1995 | Moslehi |
| 5,960,254 | A | 9/1999 | Cronin |
| 6,022,465 | A | 2/2000 | Ting et al. |
| 6,277,263 | B1 | 8/2001 | Chen |
| 6,391,166 | B1 | 5/2002 | Wang |
| 2002/0098332 | A1* | 7/2002 | Warren et al. ............ 428/209 |
| 2003/0000840 | A1 | 1/2003 | Kimura et al. |

* cited by examiner

*Primary Examiner*—Caridad M Everhart
(74) *Attorney, Agent, or Firm*—Andrew D. Fortney

(57) ABSTRACT

A method for fabricating copper wiring of a semiconductor device comprises forming a deposition stop time detection pattern having two trench structures positioned with a predetermined distance from each other on a dielectric substrate; positioning a deposition stop time detection apparatus having a plurality of detection electrodes and a guide device above the deposition stop time detection pattern; depositing copper on the substrate; and stopping deposition of the copper by an electric signal being generated when the two detection electrodes are electrically connected by the copper deposited in the two trench structure.

20 Claims, 2 Drawing Sheets

DEPOSITION STOP TIME DETECTION APPARATUS AND METHODS FOR FABRICATING COPPER USING THE SAME

RELATED APPLICATION

This patent application is a continuation of U.S. patent application Ser. No. 10/869,263, filed Jun. 16, 2004 now U.S. Pat. No. 7,122,387.

TECHNICAL FIELD

The present disclosure relates to semiconductor fabrication and, more particularly, to deposition stop time detection apparatus and methods for fabricating copper wiring using the same.

DESCRIPTION OF THE RELATED ART

Typically, the copper wiring method for fabricating semiconductor devices is performed by first forming a hole on a dielectric substrate and then depositing barrier metal thereon. A seed layer is deposited and the copper is deposited by means of an electroplating technique. That is, after depositing the copper with sufficient thickness, the copper layer is polished through a chemical-mechanical polishing (CMP) process. Such apparatuses and methods for patterning the copper wire, using the electroplating technique, are disclosed in the US Patents U.S. Pat. No. 6,391,166; U.S. Pat. No. 6,277,263; and U.S. Pat. No. 6,022,465.

In these cases, because the copper is thickly deposited and then is polished in considerable amount, these cases result in increased manufacturing costs. Additionally, the long process time for the CMP process limits the number of the wafers that can be processed per unit of time. Avoiding this problem requires additional equipment. Additionally, the contaminants generated during the CMP process can cause malfunctioning of the semiconductor device.

DETAILED DESCRIPTION

Figure 1:
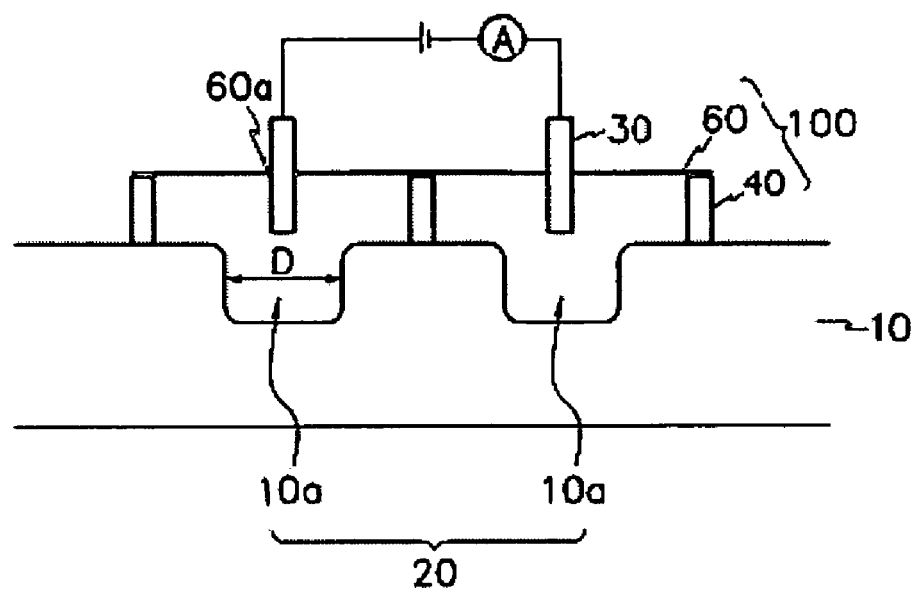
FIG. 1 is a side elevation view illustrating an example deposition stop time detection apparatus positioned on a deposition stop time detection pattern according to a disclosed method for fabricating copper wiring of a semiconductor device.

As illustrated in FIG. 1, an example deposition stop time detection apparatus comprises a plurality of detection electrodes 30 electrically connected with each other and a guide device 100 for guiding the detection electrodes 30 in a vertical direction.

The guide device 100 includes a plurality of guide pins 40 and a guide plate 60 that connects the guide pins 40 with each other and is provided with a guide hole 60a at its center through which the detection electrodes 30 pass. The guide device 100 may be made of dielectric material.

Figure 2:
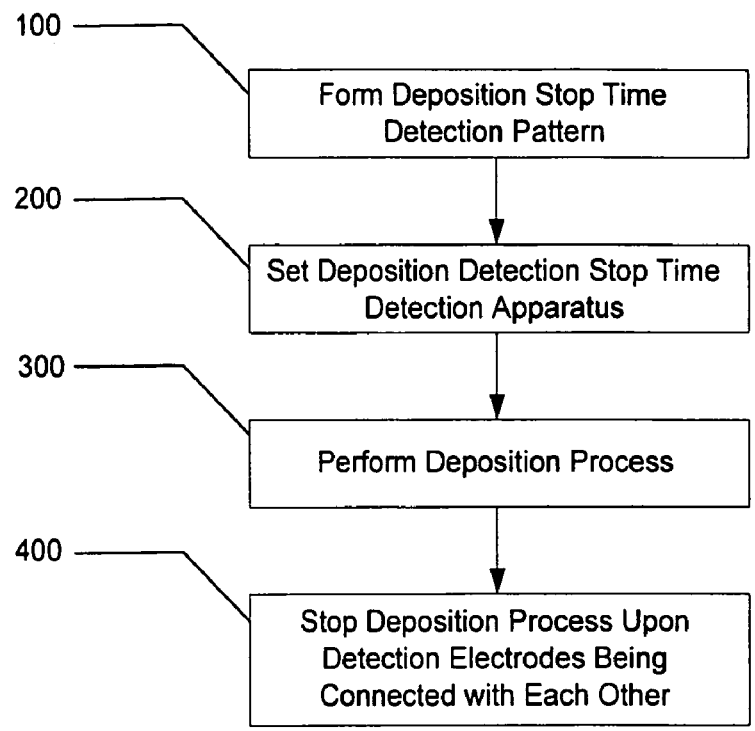
FIG. 2 is a flowchart illustrating an example method for fabricating the copper wiring of a semiconductor.

FIG. 2 is a flowchart illustrating an example method for fabricating the copper wiring of a semiconductor device. As shown in FIG. 1 and FIG. 2, first, a pair of deposition stop detection patterns 20 are formed at two trench structures 10a and 10b that are positioned with a predetermined distance on the dielectric substrate 10. The deposition stop time detection pattern 20 has a structure in that a plurality of grooves, i.e., trenches 10a, are arranged with predetermined distances. In one arrangement, the two trenches 10a are formed for one deposition stop time detection pattern 20, but more than two trenches may be used.

The width D of the trench 10a of the deposition stop time detection pattern 20 is formed so as to be broader than that of the widest pattern of the semiconductor device. The deposition stop time detection pattern 20 is formed on a scribe line. The deposition stop time detection pattern 20 can be formed on the dielectric substrate 10 during the device fabrication process (100).

The deposition stop time detection device is positioned on between the plurality of trenches 10a on the dielectric substrate 10 after the deposition stop time detection pattern 20 is formed. That is, the guide device 100 is positioned on the dielectric substrate 10. At this time, the guide pins 40 of the guide device 100 are positions between the trenches 10a on the dielectric substrate 10.

Subsequently, the detection electrode 30 is located inside of the guide hole 60a of the guide pins 40. In this case, the detection electrode 30 may be positioned over the deposition stop time detection pattern 20. That is, the detection electrode 30 may be positioned inside the trench 10a with a predetermined distance from the sidewalls of the trench 10a and a predetermined height above the horizontal surface of the dielectric substrate 10. The thickness of the detection electrode 30 is formed so as to be narrower than width of the trench 10a (200).

Next, the copper deposition process is carried out using an electroplating (EP) process. During the EP process, the copper is deposited on the dielectric substrate 10 and inside the trench 10a (300). When the copper is deposited on the two trench structures of the deposition stop time detection pattern 20 to a height that electrically connects the detection electrodes 30 with each other, an electric signal is generated, resulting in stopping of the copper deposition process.

Figure 3:
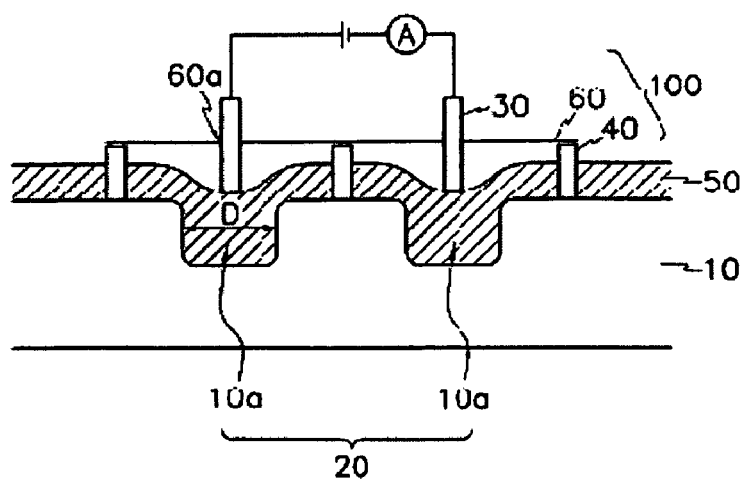
FIG. 3 is a sectional view illustrating an example deposition stop time during fabrication of the copper wiring of a semiconductor.

That is, as illustrated in FIG. 3, if the thin copper film 50 is filled in the trench 10a of the deposition stop time detection pattern 20, which is broader than the pattern of the semiconductor, the two detection electrodes 30 are electrically connected through the deposited thin copper film 50. Accordingly, an electrical feed back signal is transmitted to the copper plating apparatus to stop the copper deposition process (400).

The deposition stop time detection apparatus and the method for fabrication the copper wiring of the semiconductor using the deposition stop time detection apparatus as disclosed herein detects the time at which the deposition process should stop by positioning detection electrodes over the deposition stop time detection pattern, such that it is possible to prevent the copper from being deposited too thickly inside the trenches or vias.

As disclosed herein, a deposition stop time detection apparatus and a method for fabricating copper wiring is capable of preventing the copper from being thickly deposited in trenches of semiconductor devices. An example deposition stop time detection apparatus includes a plurality of detection electrodes electrically coupled with each other and a guide device for vertically guiding and positioning the detection electrodes. In such an arrangement, the guide device includes a plurality of guide pins and a guide plate for connecting the guide pins with each other. In one arrangement, the guide plate may include a guide hole at its center through which the detection electrodes pass. The guide device may be made of dielectric material.

The disclosed methods for fabricating the copper wiring of the semiconductor includes forming a deposition stop time detection pattern positioned with a predetermined distance to two trench structures on the dielectric substrate; positioning a deposition stop time detection apparatus having detection electrodes and a guide device on the deposition stop time pattern; performing a copper deposition process; stopping the copper deposition process when the detection electrodes being electrically connected with each other so as to generate an electric signal due to copper deposition in the trenches.

Also, the deposition stop time detection pattern may be formed on a scribe line. A width of the trench may be formed so as to be wider than that of a widest one among patterns of the semiconductor device being fabricated. The detection electrodes may also be positioned inside of the trenches with predetermined distances from side walls of the trenches. The thickness of each detection electrode may be thinner than that of the trench. The detection electrodes may be positioned with a predetermined height above a horizontal line or surface of the dielectric substrate.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A deposition stop time detection apparatus comprising:
   a plurality of detection electrodes;
   a guide device positioned on a semiconductor substrate for positioning the detection electrodes at a predetermined distance vertically and horizontally inside a plurality of corresponding trenches in the semiconductor substrate; and
   a circuit electrically connected to the plurality of detection electrodes and configured to generate an electric signal when at least two of the plurality of detection electrodes are electrically connected by a metal layer deposited in the trenches.

2. The apparatus of claim 1, wherein the guide device comprises a dielectric material.

3. The apparatus of claim 1, wherein each detection electrode has a thickness less than a width of the trench.

4. The apparatus of claim 1, wherein each detection electrode has a low end positioned a predetermined distance above the dielectric substrate.

5. The apparatus of claim 1, wherein each detection electrode is positioned inside a corresponding trench a predetermined distance from a sidewall of the trench.

6. The apparatus of claim 1, wherein the detection electrodes are guided in a vertical direction by the guide device.

7. The apparatus of claim 1, wherein the trenches have a width greater than that of a widest pattern of the semiconductor device.

8. The apparatus of claim 1, wherein the guide device comprises a plurality of guide pins.

9. The apparatus of claim 8, wherein the guide pins of the guide device are positioned on the substrate between the trenches.

10. The apparatus of claim 8, further comprising a guide plate.

11. The apparatus of claim 10, wherein the guide pins are mechanically coupled to the guide plate.

12. The apparatus of claim 10, wherein the guide plate further comprises at least one void through which the plurality of detection electrodes pass.

13. The apparatus of claim 10, wherein the guide plate comprises a plurality of guide holes through which the detection electrodes pass.

14. The apparatus of claim 1, wherein each detection electrode is positioned over a deposition stop time detection pattern.

15. The apparatus of claim 14, wherein the deposition stop time detection pattern comprises the plurality of trenches.

16. A deposition stop time detection apparatus comprising:
    a plurality of detection electrodes;
    a guide device for positioning the detection electrodes at a predetermined distance vertically and horizontally inside a plurality of corresponding trenches in a semiconductor substrate, wherein the guide device comprises a plurality of guide pins and a guide plate having a plurality of guide holes through which plurality of detection electrodes pass; and
    a circuit electrically connected to the plurality of detection electrodes and configured to generate an electric signal when at least two of the plurality of detection electrodes are electrically connected by a metal layer deposited in the trenches.

17. The apparatus of claim 16, wherein the guide device comprises a guide plate.

18. The apparatus of claim 16, wherein the guide device is positioned on the substrate.

19. A deposition stop time detection apparatus comprising:
    a plurality of detection electrodes;
    a guide device for positioning the detection electrodes at a predetermined distance vertically and horizontally inside a plurality of corresponding trenches in a semiconductor substrate, wherein the guide device comprises a plurality of guide pins that are positioned on the substrate between the trenches; and
    a circuit electrically connected to the plurality of detection electrodes and configured to generate an electric signal when at least two of the plurality of detection electrodes are electrically connected by a metal layer deposited in the trenches.

20. The apparatus of claim 19, wherein the guide device further comprises a guide plate.

* * * * *